United States Patent
Tian et al.

(10) Patent No.: US 9,066,448 B2
(45) Date of Patent: Jun. 23, 2015

(54) INSERT BOX WITH FRONT AND REAR INSERTION AND HEAT DISSIPATION METHOD THEREOF

(75) Inventors: Weiqiang Tian, Shenzhen (CN); Jiye Xu, Santa Clara, CA (US); Mengliang Hao, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 496 days.

(21) Appl. No.: 13/325,458

(22) Filed: Dec. 14, 2011

(65) Prior Publication Data

US 2012/0090821 A1 Apr. 19, 2012

Related U.S. Application Data

(63) Continuation of application No. PCT/CN2009/072274, filed on Jun. 15, 2009.

(51) Int. Cl.
 *F28D 7/00* (2006.01)
 *H05K 7/20* (2006.01)

(52) U.S. Cl.
 CPC .................................. *H05K 7/20572* (2013.01)

(58) Field of Classification Search
 CPC ....................... H05K 7/20736; H05K 7/20572
 USPC ......... 454/184, 190, 193, 228, 234, 237, 251, 454/252, 253; 165/164, 165; 361/695
 See application file for complete search history.

(56) References Cited

U.S. PATENT DOCUMENTS

| | | | |
|---|---|---|---|
| 5,813,243 A * | 9/1998 | Johnson et al. ............... | 62/259.2 |
| 6,704,196 B1 * | 3/2004 | Rodriguez et al. ........ | 361/679.33 |
| 7,283,359 B2 * | 10/2007 | Bartell et al. ................. | 361/695 |
| 2006/0044756 A1 * | 3/2006 | Wong ............................ | 361/695 |
| 2006/0092609 A1 | 5/2006 | Mandel et al. | |
| 2007/0019380 A1 | 1/2007 | Campbell et al. | |
| 2007/0058339 A1 * | 3/2007 | Hoffman et al. .............. | 361/688 |
| 2007/0139882 A1 | 6/2007 | Bartell et al. | |
| 2007/0217157 A1 * | 9/2007 | Shabany et al. ............... | 361/701 |
| 2007/0274039 A1 | 11/2007 | Hamlin | |

FOREIGN PATENT DOCUMENTS

| | | |
|---|---|---|
| CN | 1901792 A | 1/2007 |
| CN | 101014236 A | 8/2007 |
| CN | 101291574 A | 10/2008 |
| EP | 0020084 A1 | 12/1980 |
| WO | WO 2008/014627 A2 | 2/2008 |

OTHER PUBLICATIONS

Foreign Communication From a Counterpart Application, Chinese Application No. 200980155902.X, Chinese Search Report dated May 30, 2013, 2 pages.

International Search Report from the Chinese Patent Office in International Application No. PCT/CN2009/072274 mailed Feb. 11, 2010.

Written Opinion of the International Searching Authority (translation) dated (mailed) Feb. 11, 2010, issued in related Application No. PCT/CN2009/072274, Huawei Technologies Co., Ltd.

Extended European Search Report dated (mailed) May 14, 2012, issued in related Application No. 9845983.7-1232, PCT/CN2009072274, Hauwei Technologies Co., Ltd.

\* cited by examiner

*Primary Examiner* — Gregory Huson
*Assistant Examiner* — Dana Tighe
(74) *Attorney, Agent, or Firm* — Conley Rose, P.C.; Grant Rodolph; Nicholas K. Beaulieu

(57) ABSTRACT

The embodiments of the present invention provide an insert box with front and rear insertion and a heat dissipation method of the insert box. The insert box includes a front board area, a backboard, and a rear board area. A first air flow passing from a first wind inlet at an upper end portion at a front side of the insert box passes through one of the front board area and the rear board area; and a second air flow passing from a second wind inlet at a lower end portion at the front side of the insert box passes through the other one of the front board area and the rear board area.

15 Claims, 6 Drawing Sheets

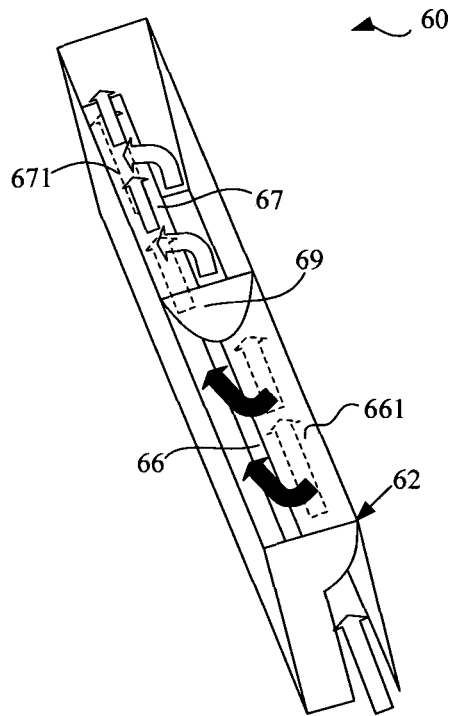

FIG. 8

| A first air flow passing from a first wind inlet at an upper end portion at a front side of the insert box passes through one of the front single board area and the rear single board area, and flows out from a second wind outlet at a lower end portion at a rear side of the insert box. | ~101 |

| A second air flow passing from a second wind inlet at a lower end portion at the front side of the insert box passes through the other one of the front single board area and the rear single board area, and flows out from the first wind outlet at an upper end portion at the rear side of the insert box with front and rear insertion. | ~102 |

FIG. 9

INSERT BOX WITH FRONT AND REAR INSERTION AND HEAT DISSIPATION METHOD THEREOF

CROSS-REFERENCE TO RELATED APPLICATION

This application is a continuation of International Application No. PCT/CN2009/072274, filed on Jun. 15, 2009, which is hereby incorporated by reference in its entirety.

FIELD OF THE INVENTION

The present invention relates to the heat dissipation technical field, and in particular, to an insert box with front and rear insertion and a heat dissipation method of the insert box.

BACKGROUND OF THE INVENTION

With the development of the communication technology, when an insert box has a fixed height, a service processing capability of a product can be enhanced by adopting an insert box with opposite insertion. However, while the service processing capability of the product is enhanced, a heat dissipation capability of the insert box with opposite insertion is challenged.

FIG. 1 is a schematic view of an insert box with front and rear insertion in the prior art. An insert box with front and rear insertion 100 includes a front single board area 10, a rear single board area 30, and a backboard 50. Single boards are vertically inserted in the front single board area 10, and single boards are vertically inserted in the rear single board area 30. A wind outlet duct 70 is formed above the front single board area 10, the rear single board area 30, and the backboard 50, and a wind inlet duct 90 is formed below the front single board area 10, the rear single board area 30, and the backboard 50. Still referring to FIG. 1, a wind inlet 91 is opened below the front single board area 10 and at a front side of the insert box with front and rear insertion 100; a wind outlet 71 is opened above the rear single board area 30 and at a rear side of the insert box with front and rear insertion 100; and a fan unit 73 is disposed in the wind outlet 71 in the wind outlet duct 70.

When the single boards in the insert box with front and rear insertion 100 are working, the fan unit 73 starts to work, so under the effect of the fan unit 73, air outside the insert box with front and rear insertion 100 flows in the wind inlet duct 90 through the wind inlet 91, then flows upward along areas between the single boards of the front single board area 10 and areas between the single boards of the rear single board area 30, and eventually flows through the wind outlet duct 70 and flows out from the wind outlet 71. Therefore, when the air outside the insert box with front and rear insertion 100 flows through the single board area, the air can take away the heat generated by devices on the single boards, so as to realize heat dissipation for the insert box with front and rear insertion 100.

The fan unit 73 is located at the wind outlet 71, and under the effect of the fan unit 73, the air flows passing through the single board area of the front single board area 10 and the single board area of the rear single board area 30 are not uniform, so heat dissipation capabilities in the front single board area 10 and the rear single board area 30 may be different, thereby influencing the heat dissipation capability of the insert box with front and rear insertion 100.

SUMMARY OF THE INVENTION

Embodiments of the present invention provide an insert box with front and rear insertion and a heat dissipation method of the insert box, so as to enhance a heat dissipation capability of the insert box with front and rear insertion.

An embodiment of the present invention provides an insert box with front and rear insertion, where the insert box includes: a front single board area, a backboard, and a rear single board area. A first wind inlet is formed at an upper end portion at a front side of the insert box, and a first wind outlet is formed at an upper end portion at a rear side of the insert box. A second wind inlet is formed at a lower end portion at a front side of the insert box, and a second wind outlet is formed at a lower end portion at a rear side of the insert box. A wind duct intersecting isolation device is disposed in the insert box. A first air flow passing through the first wind inlet passes through one of the front single board area and the rear single board area, and flows out from the second wind outlet. A second air flow passing through the second wind inlet passes through the other one of the front single board area and the rear single board area, and flows out from the first wind outlet. The wind duct intersecting isolation device is configured to isolate the first air flow and the second air flow when the first air flow and the second air flow pass through the wind duct intersecting isolation device.

An embodiment of the present invention further provides a heat dissipation method of an insert box with front and rear insertion, where the insert box includes a front single board area, a backboard, and a rear single board area. A first air flow passing through a first wind inlet at an upper end portion at a front side of the insert box passes through one of the front single board area and the rear single board area, and flows out from a second wind outlet at a lower end portion at a rear side of the insert box. A second air flow passing through a second wind inlet at a lower end portion at the front side of the insert box passes through the other one of the front single board area and the rear single board area, and flow outs from a first wind outlet at an upper end portion at the rear side of the insert box with front and rear insertion. The first air flow and the second air flow are isolated from each other.

The air flow passing through the front single board area and the air flow passing through the rear single board area are relatively uniform, so as to ensure that the front single board area and the rear single board area have the same heat dissipation capability, thereby enhancing the heat dissipation capability of the insert box.

BRIEF DESCRIPTION OF THE DRAWINGS

To make the technical solutions of the present invention or the prior art more comprehensible, accompanying drawings required to be used in the descriptions of embodiments and the prior art are simply described below. Apparently, the accompanying drawings described below merely demonstrate some of the embodiments of the present invention. Based on the accompanying drawings, those of ordinary skill in the art may obtain other accompanying drawings without making creative efforts.

FIG. 8 is a schematic three-dimensional structural view of a wind duct intersecting isolation device according to an embodiment of the present invention;

FIG. 9 is a schematic flow chart of a heat dissipation method of an insert box with front and rear insertion according to an embodiment of the present invention.

DETAILED DESCRIPTION OF THE EMBODIMENTS

The technical solutions of the embodiments of the present invention are completely described below clearly with reference to the accompanying drawings. Apparently, the embodiments in the following descriptions are merely a part of the embodiments of the present invention, rather than all the embodiments of the present invention. Persons of ordinary skill in the art can derive other embodiments based on the embodiments of the present invention without creative efforts, which all fall within the scope of the present invention.

Embodiment 1

Figure 1:
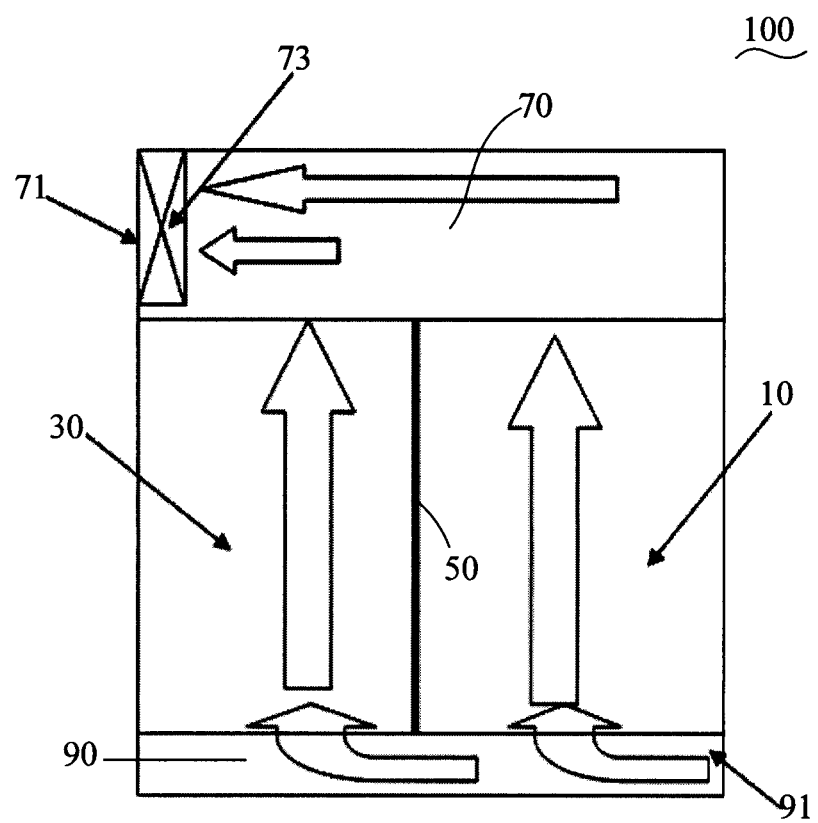
FIG. 1 is a schematic view of an insert box with front and rear insertion in the prior art.
Figure 2:
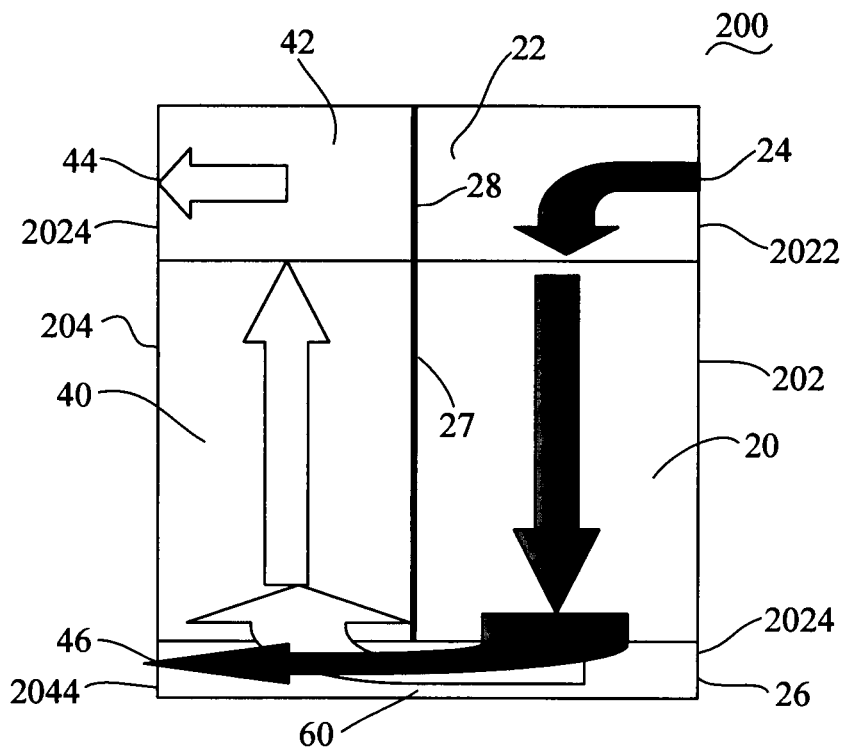
FIG. 2 is a schematic view of an insert box with front and rear insertion according to an embodiment of the present invention.
Figure 3:
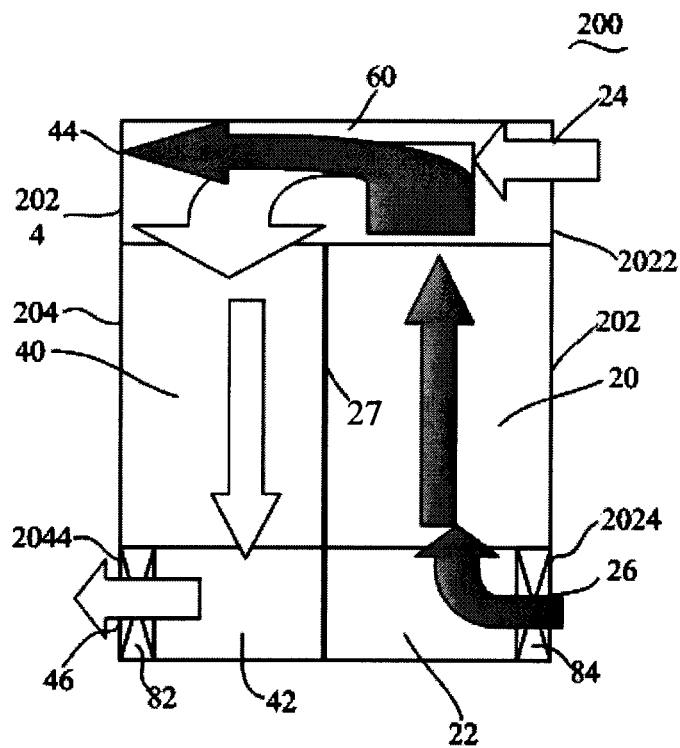
FIG. 3 is a schematic view of an insert box with front and rear insertion according to an embodiment of the present invention.

Referring to FIG. 2 and FIG. 3, FIG. 2 is a schematic view of an insert box with front and rear insertion according to an embodiment of the present invention, and FIG. 3 is a schematic view of an insert box with front and rear insertion according to another embodiment of the present invention.

An insert box with front and rear insertion 200 includes a front single board area 20, a backboard 27, and a rear single board area 40. A first wind inlet 24 is formed at an upper end portion 2022 at a front side 202 of the insert box, and a first wind outlet 44 is formed at an upper end portion 2024 at a rear side 204 of the insert box. A second wind inlet 26 is formed at a lower end portion 2024 at the front side 202 of the insert box, and a second wind outlet 46 is formed at a lower end portion 2044 at the rear side 204 of the insert box. A wind duct intersecting isolation device 60 is disposed in the insert box 200. A first air flow passing through the first wind inlet 24 passes through one of the front single board area 20 and the rear single board area 40, and flows out from the second wind outlet 46. A second air flow passing through the second wind inlet 26 passes through the other one of the front single board area 20 and the rear single board area 40, and flows out from the first wind outlet 44. The wind duct intersecting isolation device 60 is configured to isolate the first air flow and the second air flow when the first air flow and the second air flow pass through the wind duct intersecting isolation device 60.

The air flow passing through the front single board area and the air flow passing through the rear single board area are relatively uniform, so as to ensure that the front single board area and the rear single board area have the same heat dissipation capability, thereby enhancing the heat dissipation capability of the insert box.

The wind duct intersecting isolation device 60 is disposed below the front single board area 20, the backboard 27, and the rear single board area 40 (referring to FIG. 2), or the wind duct intersecting isolation device 60 is disposed above the front single board area 20, the backboard 27, and the rear single board area 40 (referring to FIG. 3).

Figure 5:
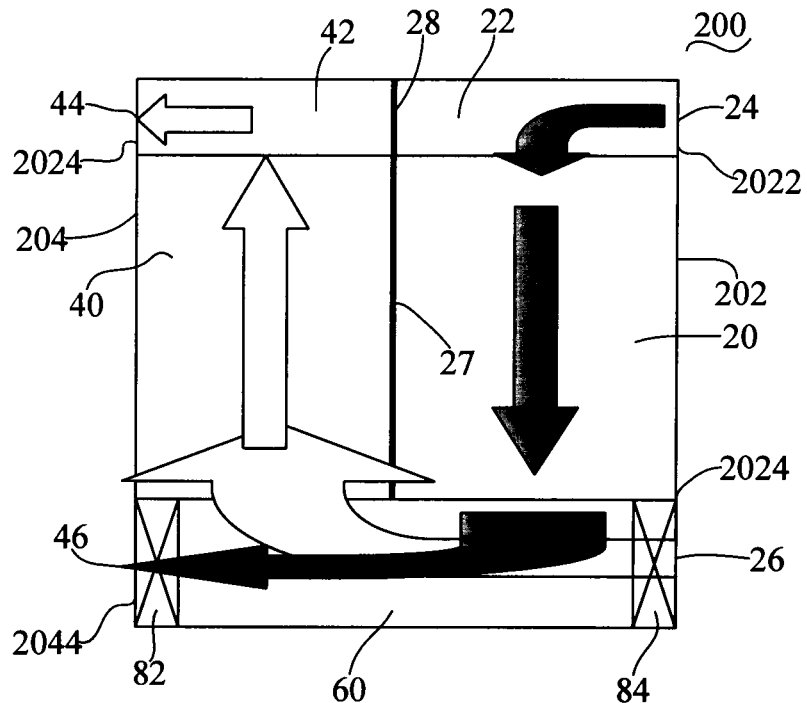
FIG. 5 is a schematic view of a fan unit of an insert box with front and rear insertion according to an embodiment of the present invention.

Referring to FIG. 5, the first wind inlet 24, the front single board area 20, the wind duct intersecting isolation device 60, and the second wind outlet 46 form a first air flow channel (as shown by gray arrows in FIG. 5), and a first fan unit 82 is disposed in the first air flow channel. The second wind inlet 26, the wind duct intersecting isolation device 60, the rear single board area 40, and the first wind outlet 44 form a second air flow channel (as shown by white arrows in FIG. 5), and a second fan unit 84 is disposed in the second air flow channel.

Referring to FIG. 3, the first wind inlet 24, the wind duct intersecting isolation device 60, the rear single board area 40, and the second wind outlet 46 form a first air flow channel (as shown by white arrows in FIG. 3), and a first fan unit 82 is disposed in the first air flow channel. The second wind inlet 26, the front single board area 20, the wind duct intersecting isolation device 60, and the first wind outlet 44 form a second air flow channel (as shown by gray arrows in FIG. 3), and a second fan unit 84 is disposed in the second air flow channel.

As can be seen from FIG. 5 and FIG. 3, the first fan unit 82 is disposed in the first air flow channel, and the second fan unit 84 is disposed in the second air flow channel, so under the effect of the first fan unit 82 and the second fan unit 84, flowing speeds of the first air flow and the second air flow can be further enhanced, so as to achieve better heat dissipation for the insert box 200.

Further referring to FIG. 2, the wind duct intersecting isolation device 60 is disposed below the front single board area 20, the backboard 27, and the rear single board area 40, a wind inlet duct 22 can be formed above the front single board area 20, a wind outlet duct 42 is formed above the rear single board area, and also, the wind inlet duct 22 and the wind outlet duct 42 are isolated from each other.

The first air flow flowing in from the first wind inlet 24 passes through the wind inlet duct 22 (as shown by gray arrows in FIG. 2), then passes through the front single board area 20 and the wind duct intersecting isolation device 60, and flows out from the second wind outlet 46; at the same time, the second air flow flowing in from the second wind inlet 26 passes through the wind duct intersecting isolation device 60 (as shown by white arrows in FIG. 2), passes through the rear single board area 40 through the wind duct intersecting isolation device 60, then passes through the wind outlet duct 42, and flows out from the first wind outlet 44.

As can be seen from FIG. 2, the first air flow flowing in from the first wind inlet 24 (that is, flowing in from upper front of the insert box 200) passes through the wind inlet duct 22, and then passes through front single board area 20, and the air flow passing through the front single board area 20 flows out from the second wind outlet 46 (that is, flows out from lower rear of the insert box 200) through the wind duct intersecting isolation device 60; the second air flow flowing in from the second wind inlet 26 (that is, flowing in from lower front of the insert box 200) passes through the wind duct intersecting isolation device 60, then passes through the rear single board area 40 through the wind duct intersecting isolation device 60, then passes through the wind outlet duct 42, and flows out from the first wind outlet 44 (that is, flows out from upper rear of the insert box 200). Therefore, the air flow passing through the front single board area 20 and the air flow passing through the rear single board area 40 are relatively uniform, so as to ensure that the front single board area 20 and the rear single board area 40 have the same heat dissipation capability, thereby enhancing the heat dissipation capability of the insert box 200.

Further referring to FIG. 3, the wind duct intersecting isolation device 60 is disposed above the front single board area 20, the backboard 27, and the rear single board area 40, the wind inlet duct 22 can be formed below the front single board area 20, the wind outlet duct 42 can be formed below the rear single board area, and also, the wind inlet duct 22 and the wind outlet duct 42 are isolated from each other.

As can be seen from FIG. 3, the first air flow flowing in from the first wind inlet 24 (that is, flowing in from upper front of the insert box 200) passes through the wind duct intersecting isolation device 60, passes through the rear single board area 40 through the wind duct intersecting isolation device 60, then passes through the wind outlet duct 42, and flows out from the second wind outlet 46 (that is, flows out from lower rear of the insert box 200); the second air flow flowing in from the second wind inlet 26 (that is, flowing in from lower front of the insert box 200) passes through the wind inlet duct 22, then passes through the front single board area 20, and the air flow passing through the front single board area 20 flows out from the first wind outlet 44 (that is, flows out from upper rear of the insert box 200) through the wind duct intersecting isolation device 60. Therefore, the air flow passing through the front single board area 20 and the air flow passing through the rear single board area 40 are relatively uniform, so as to ensure that the front single board area 20 and the rear single board area 40 have the same heat dissipation capability, thereby enhancing the heat dissipation capability of the insert box 200.

Figure 4:
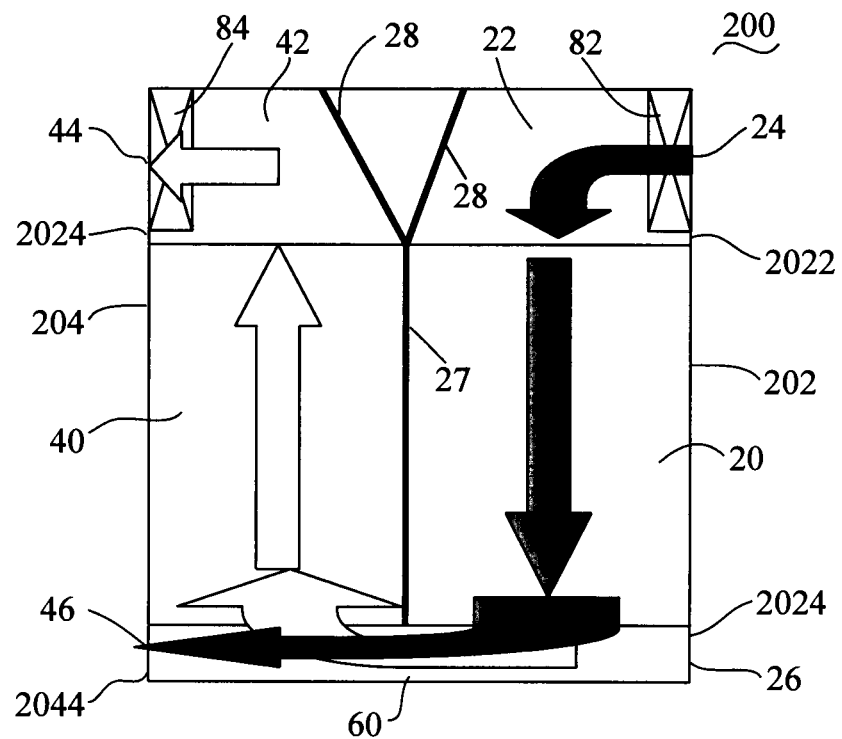
FIG. 4 is a schematic view of a fan unit of an insert box with front and rear insertion according to an embodiment of the present invention.

Furthermore, FIG. 4 is a schematic view of an insert box with front and rear insertion according to an embodiment of the present invention. A wind inlet duct 22 may also exist in the first air flow channel, so the first wind inlet 24, the wind inlet duct 22, the front single board area 20, the wind duct intersecting isolation device 60, and the second wind outlet 46 form a first air flow channel (as shown by gray arrows in FIG. 4); and a wind outlet duct 42 may also exist in the second air flow channel, so the second wind inlet 26, the wind duct intersecting isolation device 60, the rear single board area 40, the wind outlet duct 42, and the first wind outlet 44 form a second air flow channel (as shown by white arrows in FIG. 4). The insert box 200 further includes a first fan unit 82 and a second fan unit 84, the first fan unit 82 is disposed in the first air flow channel, and the second fan unit 84 is disposed in the second air flow channel.

Further referring to FIG. 4, the first fan unit 82 is disposed in the first wind inlet 24, and the second fan unit 84 is disposed in the first wind outlet 44, so under the effect of the first fan unit 82, a flowing speed of the air flow passing through the first air flow channel can be enhanced, and similarly, under the effect of the second fan unit 84, a flowing speed of the air flow passing through the second air flow channel can also be enhanced. Therefore, the heat dissipation capability of the insert box with front and rear insertion 200 can be further enhanced by disposing the first fan unit 82 in the first wind inlet 24 and disposing the second fan unit 84 in the first wind outlet 44.

The first fan unit 82 being disposed in the first wind inlet 24 and the second fan unit 84 being disposed in the first wind outlet 44 in FIG. 4 may also have the following variants.

Referring to FIG. 5, the second fan unit 84 is disposed in the second wind inlet 26 and the first fan unit 82 is disposed in the second wind outlet 46.

Figures 6, 7:
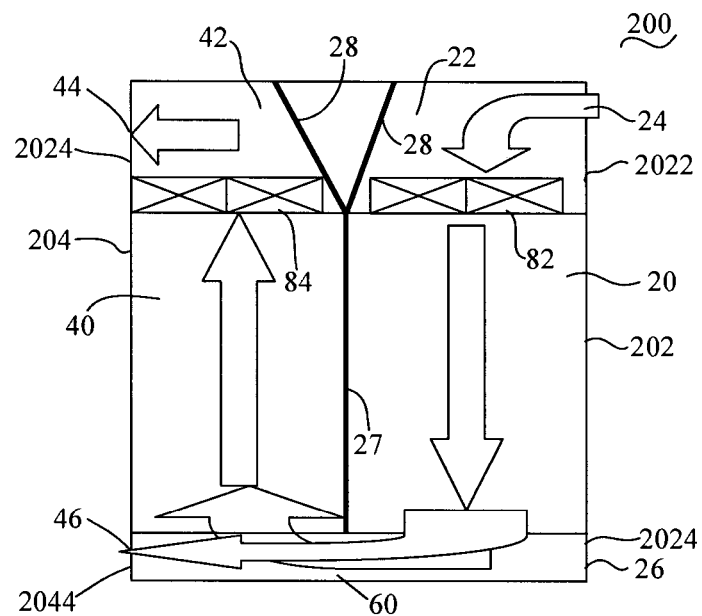
FIG. 6 is a schematic view of a fan unit of an insert box with front and rear insertion according to an embodiment of the present invention.
FIG. 7 is a schematic three-dimensional structural view of a wind duct intersecting isolation device according to an embodiment of the present invention.

Referring to FIG. 6, in the wind inlet duct 22, the first fan unit 82 is disposed above the front single board area 20, and in the wind outlet duct 42, the second fan unit 84 is disposed above the rear single board area 40.

It can be understood that for the disposing of the fan units in the embodiment, the fan units can also be respectively disposed in the first wind inlet 24, the first wind outlet 44, the second wind inlet 26, and the second wind outlet 46; the fan units can also be respectively disposed at the first wind inlet 24, at the first wind outlet 44, above the front single board area 20, and above the rear single board area 40; and the embodiments of the present invention are not limited thereto.

The wind inlet duct 22 and the wind outlet duct 42 being isolated from each other can also adopt the structures as shown in FIG. 2 and FIG. 5. Referring to FIG. 2 and FIG. 5, the wind inlet duct 22 and the wind outlet duct 42 can be isolated through a barrier 28.

In another embodiment, the backboard 27 can also extend upward to isolate the wind inlet duct 22 and the wind outlet duct 42.

The wind inlet duct 22 and the wind outlet duct 42 being isolated from each other may also adopt the structures as shown in FIG. 4 and FIG. 6. Referring to FIG. 4 and FIG. 6, the wind inlet duct 22 and the wind outlet duct 42 can be isolated through a barrier 28. The two barriers 28 and the backboard 27 form a Y-shaped structure, and as shown in FIG. 4 and FIG. 6, one barrier 28 tilts toward the first wind inlet 24, and the other barrier 28 tilts toward the first wind outlet 44. Therefore, a part of the air flow outside the insert box flows in the wind inlet duct 22 from the first wind inlet 24, and is guided into the front single board area 20 by one barrier 28; and the other part of the air flow outside the insert box flows in the wind duct intersecting isolation device 60 from the second wind inlet 26, passes through the rear single board area 40 through the wind duct intersecting isolation device 60, and the air flow is guided out from the first wind outlet 44 by the other barrier 28.

In this embodiment, the front single board area 20 and the rear single board area 40 in the insert box with front and rear insertion are opposite to each other. In this embodiment, referring to FIG. 2 to FIG. 6, the illustration is given in the case that the front single board area 20 is at a right side of the insert box and the rear single board area 40 is at a left side of the insert box. It can be understood that the front single board area can also be at the left side of the insert box and the rear single board area can also be at the right side of the insert box, and the embodiments of the present invention are not limited thereto.

The wind duct intersecting isolation device 60 in the insert box is illustrated in the following.

Embodiment 2

FIG. 7 is a schematic three-dimensional structural view of a wind duct intersecting isolation device according to an embodiment of the present invention.

The wind duct intersecting isolation device 60 includes a frame body 62, and the frame body forms a first wind duct 63 and a second wind duct 65. Further referring to FIG. 7, two opposite end faces of the frame body 62 are respectively opened with a first wind duct inlet 631 and a second wind duct outlet 652 (that is, an end face 623 of the frame body 62 is opened with the first wind duct inlet 631, and the other end face 624 of the frame body 62, that is, a face opposite to the end face 623, is opened with the second wind duct outlet 652), the first wind duct inlet 631 is in communication with the first wind duct 63, the second wind duct 65 is in communication with the second wind duct outlet 652, and also, the first wind duct 63 and the second wind duct 65 are isolated from each other.

Further referring to FIG. 7, black arrows represent the air flow flowing in the wind duct intersecting isolation device 60 from the front single board area 20; white arrows represent the air flow flowing in the wind duct intersecting isolation device 60 from the second wind inlet 26 at the lower end portion 2024 at the front side 202 of the insert box with front and rear insertion 200.

The air flows of the wind duct intersecting isolation device 60 are illustrated in the following.

Further referring to FIG. 2 and FIG. 7, when the insert box with front and rear insertion 200 is used for heat dissipation, the first air flow flowing in from the first wind inlet 24 passes through the wind inlet duct 22, and then passes through the front single board area 20, and the air flow passing through the front single board area 20 passes along the second wind duct 65 and the second wind duct outlet 652, and flows out from the second wind outlet 46; and the second air flow flowing in from the second wind inlet 26 passes through the first wind duct inlet 631, then passes through the first wind duct 63, passes through the rear single board area 40 from the first wind duct 63, then passes through the wind outlet duct 42, and flows out from the first wind outlet 44.

It can be seen from above description, the wind duct intersecting isolation device 60 is disposed in the insert box with front and rear insertion 200, so the air flow passing through the front single board area 20 and the air flow passing through the rear single board area 40 are isolated from each other. The first air flow flows in from upper front of the insert box 200 and flows out from lower rear of the insert box 200; and the second air flow flows in from lower front of the insert box 200 and flows out from upper rear of the insert box 200, and therefore, the air flow passing through the front single board area 20 and the air flow passing through the rear single board area 40 are relatively uniform, so as to ensure that the front single board area 20 and the rear single board area 40 have the same heat dissipation capability, thereby enhancing the heat dissipation capability of the insert box 200.

Further referring to FIG. 7, two opposite end faces (that is, the first end face 623 and the second end face 624) of the frame body 62 are respectively opened with the first wind duct inlet 631 and the second wind duct outlet 652, the first wind duct inlet 631 and the second wind duct outlet 652 may be interlacedly disposed, so the air flow passing through the second wind duct 65 may flow out from the second wind duct outlet 652 more easily and the second air flow outside the insert box 200 may pass through the first wind duct 63 more easily.

Further referring to FIG. 7, a baffle 69 is formed in the frame body 62, and between the baffle 69 and the end face 623 (the first end face 623), a side surface 621 (that is, the first side surface 621) of the frame body 62 tilts downward towards inside of the frame body 62 to form a first barrier 66; and between the baffle 69 and the end face 624 (the second end face 624), the other side surface 622 (that is, the second side surface 622 opposite to the side surface 621) of the frame body 62 tilts downward towards inside of the frame body 62 to form a second barrier 67. Therefore, the first wind duct 63 is formed between the side surface 621 and the first barrier 66, and between the side surface 621 and the second barrier 67; and the second wind duct 65 is formed between the side surface 622 and the first barrier 66, and between the side surface 622 and the second barrier 67.

For the wind duct intersecting isolation device 60 in Embodiment 2, a tilted surface 661 of the first barrier 66 tilting downward may be a tilted flat shape, and a tilted surface 671 of the second barrier 67 tilting downward may also be a tilted flat shape.

Referring to FIG. 8, the tilted surface 661 of the first barrier 66 tilting downward may also be a tilted curve shape, and the tilted surface 671 of the second barrier 67 tilting downward may also be a tilted curve shape.

Embodiment 3

FIG. 9 is a schematic flow chart of a heat dissipation method of an insert box with front and rear insertion according to an embodiment of the present invention.

Further referring to FIG. 2, FIG. 7, and FIG. 8, or referring to FIG. 3, FIG. 7, and FIG. 8, the insert box with front and rear insertion includes a front single board area 20, a backboard 27, and a rear single board area 40, and a heat dissipation method of an insert box with front and rear insertion according to an embodiment of the present invention includes the following steps.

In step 101, a first air flow passing from a first wind inlet 24 at an upper end portion 2022 at a front side 202 of the insert box passes through one of the front single board area 20 and the rear single board area 40, and flows out from a second wind outlet 46 at a lower end portion 2044 at a rear side 204 of the insert box.

In step 102, a second air flow passing from a second wind inlet 26 at a lower end portion 2024 at the front side 202 of the insert box passes through the other one of the front single board area 20 and the rear single board area 40, and flows out from the first wind outlet 44 at an upper end portion 2024 at the rear side 204 of the insert box with front and rear insertion.

The first air flow and the second air flow are isolated from each other.

It can be seen from above description, in the heat dissipation method of the insert box with front and rear insertion according to the embodiment of the present invention, the air flow passing through the front single board area 20 and the air flow passing through the rear single board area 40 are relatively uniform, so as to ensure that the front single board area 20 and the rear single board area 40 have the same heat dissipation capability, thereby enhancing the heat dissipation capability of the insert box 200.

In the heat dissipation method of the insert box with front and rear insertion in Embodiment 3, steps 101 and 102 have no particular order, steps 101 and 102 can be performed at the same time, and the embodiments of the present invention are not limited thereto.

Referring to FIG. 2, FIG. 7, and FIG. 8, step 101 includes the following.

The first air flow passing from the first wind inlet 24 at the upper end portion 2022 at the front side 202 of the insert box passes through the wind inlet duct 22, the front single board area 20, the second wind duct 65, and the second wind duct outlet 652, and flows out from the second wind outlet 46 at the lower end portion 2044 at the rear side 204 of the insert box.

Correspondingly, step 102 includes the following.

The second air flow passing from the second wind inlet 26 at the lower end portion 2024 at the front side 202 of the insert box passes through the first wind duct inlet 631, the first wind duct 63, the rear single board area 40, and the wind outlet duct 42, and flows out from the first wind outlet 44 at the upper end portion 2024 at the rear side 204 of the insert box with front and rear insertion.

Referring to FIG. 3, FIG. 7, and FIG. 8, step 101 includes the following.

The first air flow passing from the first wind inlet 24 at the upper end portion 2022 at the front side 202 of the insert box passes through the first wind duct inlet 631, the first wind duct 63, the rear single board area 40, and the wind outlet duct 42, and flows out from the second wind outlet 46 at the lower end portion 2044 at the rear side 204 of the insert box with front and rear insertion.

Correspondingly, step 102 includes the following.

The second air flow passing from the second wind inlet 26 at the lower end portion 2024 at the front side 202 of the insert box passes through the wind inlet duct 22, the front single board area 20, the second wind duct 65, and the second wind duct inlet 652, and flows out from the first wind outlet 44 at the upper end portion 2024 at the rear side 204 of the insert box with front and rear insertion.

Figure 10:
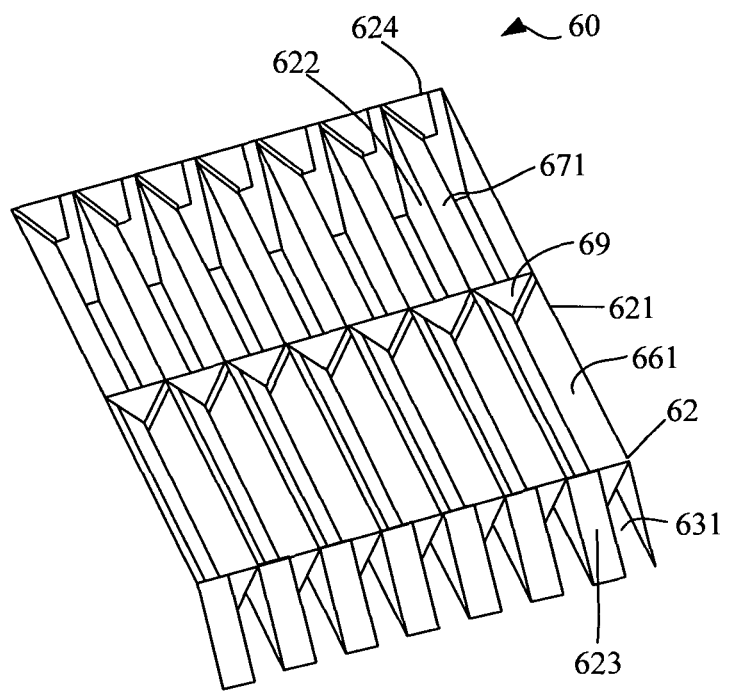
FIG. 10 is a schematic view of multiple wind duct intersecting isolation devices disposed in an insert box with front and rear insertion according to an embodiment of the present invention.

Referring to FIG. 10, for the wind duct intersecting isolation device 60 disposed in the insert box with front and rear insertion in the embodiments, a suitable number of wind duct intersecting isolation devices 60 can be selected according to a size of the insert box 200.

Single boards are vertically inserted along board guide rails in the front single board area 20 of the insert box 200, and single boards are vertically inserted along board guide rails in the rear single board area 40 of the insert box 200, so when the insert box 200 is fully loaded with single boards, a wind duct intersecting isolation device 60 (for the structure of wind duct intersecting isolation device 60, please refer to FIG. 10) is arranged at each board slot; when in the insert box 200 a part of board guide rails are not inserted with single boards, an air deflection device can be disposed in a board guide rail that is inserted with no board, so as to prevent the air flow from passing through the board slot inserted with no board.

It can be understood that the embodiments have respective emphases, Embodiments 1, 2, and 3 can be referred to for understanding the embodiments of the present invention.

The "first", "second", ..., mentioned in the embodiments are serial numbers for ease of illustration of the embodiments with reference to the accompanying drawings. The "first", "second", ..., mentioned in the foregoing do not limit the embodiments of the present invention.

The above are merely exemplary embodiments of the present invention. However, the protection scope of the present invention is not limited thereto. Changes or replacements readily derived by persons skilled in the prior art within the technical scope of the present invention should fall within the protection scope of the present invention.

What is claimed is:

1. An insert box with front and rear insertion, comprising:
a front board area;
a backboard; and
a rear board area,
wherein a first air flow passing from a first wind inlet at an upper end portion at a front side of the insert box passes through one of the front board area and the rear board area, and flows out from a second wind outlet at a lower end portion at a rear side of the insert box,
wherein a second air flow passing from a second wind inlet at a lower end portion at the front side of the insert box passes through the other one of the front board area and the rear board area, and flows out from a first wind outlet at an upper end portion at the rear side of the insert box with front and rear insertion,
wherein the first air flow and the second air flow are isolated from each other, and wherein the first wind inlet at the upper end portion at the front side of the insert box and the second wind inlet at the lower end portion at the front side of the insert box are on a same side of the insert box, and the first air flow passing from the first wind inlet is isolated from the second air flow passing from the second wind inlet.

2. The insert box with front and rear insertion according to claim 1, wherein the first air flow passing from the first wind inlet at the upper end portion at the front side of the insert box passes through a wind inlet duct, the front board area, a second wind duct, a second wind duct outlet, and flows out from the second wind outlet at the lower end portion at the rear side of the insert box.

3. The insert box with front and rear insertion according to claim 2, wherein the second air flow passing from the second wind inlet at the lower end portion at the front side of the insert box passes through a first wind duct inlet, a first wind duct, the rear board area, a wind outlet duct, and flows out from the first wind outlet at the upper end portion at the rear side of the insert box with front and rear insertion.

4. The insert box with front and rear insertion according to claim 1, wherein the first air flow passing from the first wind inlet at the upper end portion at the front side of the insert box passes through a first wind duct inlet, a first wind duct, the rear board area, a wind outlet duct, and flows out from the second wind outlet at the lower end portion at the rear side of the insert box with front and rear insertion.

5. The insert box with front and rear insertion according to claim 4, wherein the second air flow passing from the second wind inlet at the lower end portion at the front side of the insert box passes through a wind inlet duct, the front board area, a second wind duct, a second wind duct inlet, and flows out from the first wind outlet at the upper end portion at the rear side of the insert box with front and rear insertion.

6. An insert box with front and rear insertion, comprising:
a front board area;
a backboard; and
a rear board area,
wherein a first wind inlet is formed at an upper end portion at a front side of the insert box, a first wind outlet is formed at an upper end portion at a rear side of the insert box, a second wind inlet is formed at a lower end portion at the front side of the insert box, and a second wind outlet is formed at a lower end portion at the rear side of the insert box,
wherein a wind duct intersecting isolation device is disposed in the insert box, a first air flow passing from the first wind inlet passes through one of the front board area and the rear board area, and flows out from the second wind outlet, a second air flow passing from the second wind inlet passes through the other one of the front board area and the rear board area, and flows out from the first wind outlet,
wherein the wind duct intersecting isolation device is configured to isolate the first air flow and the second air flow when the first air flow and the second air flow pass through the wind duct intersecting isolation device, and
wherein the first wind inlet at the upper end portion at the front side of the insert box and the second wind inlet at the lower end portion at the front side of the insert box are on a same side of the insert box, and the first air flow passing from the first wind inlet is isolated from the second air flow passing from the second wind inlet.

7. The insert box with front and rear insertion according to claim 6, wherein the wind duct intersecting isolation device is disposed below the front board area, the backboard, and the rear board area, or the wind duct intersecting isolation device is disposed above the front board area, the backboard, and the rear board area.

8. The insert box with front and rear insertion according to claim 7, wherein when the wind duct intersecting isolation device is disposed below the front board area, the backboard, and the rear board area, a wind inlet duct is disposed above the front board area, a wind outlet duct is disposed above the rear board area, and the wind inlet duct and the wind outlet duct are isolated from each other.

9. The insert box with front and rear insertion according to claim 8, wherein when the wind inlet duct and the wind outlet duct are isolated from each other, the wind inlet duct and the wind outlet duct are isolated from each other by a barrier.

10. The insert box with front and rear insertion according to claim 8, wherein when the wind inlet duct and the wind outlet duct are isolated from each other, the backboard extends to isolate the wind inlet duct and the wind outlet duct.

11. The insert box with front and rear insertion according to claim 7, wherein when the wind duct intersecting isolation device is disposed above the front board area, the backboard, and the rear board area, a wind inlet duct is disposed below the front board area, a wind outlet duct is disposed below the rear board area, and the wind inlet duct and the wind outlet duct are isolated from each other.

12. The insert box with front and rear insertion according to claim 11, wherein when the wind inlet duct and the wind outlet duct are isolated from each other, the wind inlet duct and the wind outlet duct are isolated from each other by a barrier.

13. The insert box with front and rear insertion according to claim 11, wherein when the wind inlet duct and the wind outlet duct are isolated from each other, the backboard extends to isolate the wind inlet duct and the wind outlet duct.

14. The insert box with front and rear insertion according to claim 6, wherein the wind duct intersecting isolation device comprises a frame body, the frame body forms a first wind duct and a second wind duct, a first end face of the frame body is opened with a first wind duct inlet, a second end face of the frame body is opened with a second wind duct outlet, the first end face and the second end face are opposite to each other, the first wind duct is in communication with the first wind duct inlet, the second wind duct is in communication with the second wind duct outlet, and the first wind duct and the second wind duct are isolated from each other.

15. The insert box with front and rear insertion according to claim 6, wherein the first wind inlet, one of the front board area and the rear board area, the wind duct intersecting isolation device, and the second wind outlet form a first air flow channel, a first fan unit is disposed in the first air flow channel, the second wind inlet, the wind duct intersecting isolation device, the other one of the front board area and the rear board area, and the first wind outlet form a second air flow channel, and a second fan unit is disposed in the second air flow channel.

* * * * *